(12) United States Patent
Ulavi et al.

(10) Patent No.: US 11,682,576 B2
(45) Date of Patent: *Jun. 20, 2023

(54) PEDESTAL HEATER FOR SPATIAL MULTI-WAFER PROCESSING TOOL

(71) Applicant: Applied Materials, Inc., Santa Clara, CA (US)

(72) Inventors: Tejas Ulavi, San Jose, CA (US); Sanjeev Baluja, Campbell, CA (US); Dhritiman Subha Kashyap, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/845,230

(22) Filed: Jun. 21, 2022

(65) Prior Publication Data

US 2022/0319899 A1 Oct. 6, 2022

Related U.S. Application Data

(63) Continuation of application No. 17/066,971, filed on Oct. 9, 2020, now Pat. No. 11,430,686.

(60) Provisional application No. 62/914,373, filed on Oct. 11, 2019.

(51) Int. Cl.
  *H01T 23/00* (2006.01)
  *H01L 21/683* (2006.01)
  *H01L 21/67* (2006.01)

(52) U.S. Cl.
  CPC .... *H01L 21/6833* (2013.01); *H01L 21/67103* (2013.01)

(58) Field of Classification Search
None
See application file for complete search history.

(56) References Cited

U.S. PATENT DOCUMENTS

| | | | |
|---|---|---|---|
| 5,147,498 A * | 9/1992 | Nashimoto | H01L 21/67103 216/60 |
| 6,929,874 B2 | 8/2005 | Hiramatsu et al. | |
| 7,011,874 B2 | 3/2006 | Ito et al. | |
| 7,033,445 B2 * | 4/2006 | Keeton | H01L 21/67103 118/728 |
| 10,242,890 B2 | 3/2019 | Volfovski et al. | |
| 11,430,686 B2 * | 8/2022 | Ulavi | H01L 21/67248 |
| 2007/0103844 A1 | 5/2007 | Eguchi | |

(Continued)

FOREIGN PATENT DOCUMENTS

| | | |
|---|---|---|
| JP | H10284360 A | 10/1998 |
| WO | 2018143288 A1 | 8/2018 |

OTHER PUBLICATIONS

PCT International Search Report and Written Opinion in PCT/US2020/054994 dated Jan. 27, 2021, 11 pages.

*Primary Examiner* — Stephen W Jackson
(74) *Attorney, Agent, or Firm* — Servilla Whitney LLC

(57) ABSTRACT

Substrate supports comprising a top plate positioned on a shaft are described. The top plate including a primary heating element a first depth from the surface of the top plate, a inner zone heating element a second depth from the surface of the top plate and an outer zone heating element a third depth from the surface of the top plate. Substrate support assemblies comprising a plurality of substrate supports and methods of processing a substrate are also disclosed.

20 Claims, 4 Drawing Sheets

(56) References Cited

U.S. PATENT DOCUMENTS

2017/0306494 A1 10/2017 Lin
2019/0131167 A1 5/2019 Rice et al.

* cited by examiner

PEDESTAL HEATER FOR SPATIAL MULTI-WAFER PROCESSING TOOL

CROSS-REFERENCE TO RELATED APPLICATIONS

This application is a continuation of U.S. patent application Ser. No. 17/066,971, filed Oct. 9, 2020, which claims priority to U.S. Provisional Application No. 62/914,373, filed Oct. 11, 2019, the entire disclosures of which are hereby incorporated by reference herein.

TECHNICAL FIELD

Embodiments described herein generally relate to apparatus for semiconductor manufacturing. In particular, embodiments of the disclosure are directed to wafer pedestal heaters with improved temperature uniformity.

BACKGROUND

Temperature uniformity has one of the highest impacts on film uniformity (thickness as well as properties such as refractive index, wet etch rate, in-plane displacement, etc.). In a spatial semiconductor wafer processing chamber, wafers spend time under multiple thermal and chemical environments resulting in non-uniform or stable wafer temperatures.

Accordingly, there is a need for wafer pedestal heaters with improved thermal controls.

SUMMARY

One or more embodiments of the disclosure are directed to a substrate support comprising a top plate and a shaft. The top plate has a support surface and a bottom surface defining a thickness of the top plate. The shaft is connected to the bottom surface of the top plate and comprises a sidewall.

The top plate contains a primary heating element positioned at a first depth below the support surface. An inner zone heating element is within the top plate at a second depth from the support surface greater than the first depth. The inner zone heating element is positioned over the sidewall of the shaft. An outer zone heating element is within the top plate at a third depth from the support surface greater than the first depth. The outer zone heating element extends further from a central axis of the substrate support than the primary heating element.

Additional embodiments of the disclosure are directed to substrate support assemblies comprising a plurality of substrate supports connected to a central hub. The substrate supports are rotatable about the central hub. Each substrate support comprises a top plate with a support surface and bottom surface defining a thickness of the top plate, and a shaft connected to the bottom surface of the top plate. The shaft includes a sidewall. A primary heating element is within the top plate at a first depth below the support surface. An inner zone heating element is within the top plate at a second depth from the support surface greater than the first depth. The inner zone heating element is positioned over the sidewall of the shaft. An outer zone heating element is within the top plate at a third depth from the support surface greater than the first depth. The outer zone heating element extends further from a central axis of the substrate support than the primary heating element.

Further embodiments of the disclosure are directed to methods of processing a substrate. A substrate is chucked to a substrate support. The substrate support comprises a top plate with a support surface and bottom surface defining a thickness of the top plate, and a shaft connected to the bottom surface of the top plate. The shaft includes a sidewall. A primary heating element is within the top plate at a first depth below the support surface. An inner zone heating element is within the top plate at a second depth from the support surface greater than the first depth. The inner zone heating element is positioned over the sidewall of the shaft. An outer zone heating element is within the top plate at a third depth from the support surface greater than the first depth. The outer zone heating element extends further from a central axis of the substrate support than the primary heating element. The primary heating element, the inner zone heating element and the outer zone heating element are powered to heat the top plate and the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
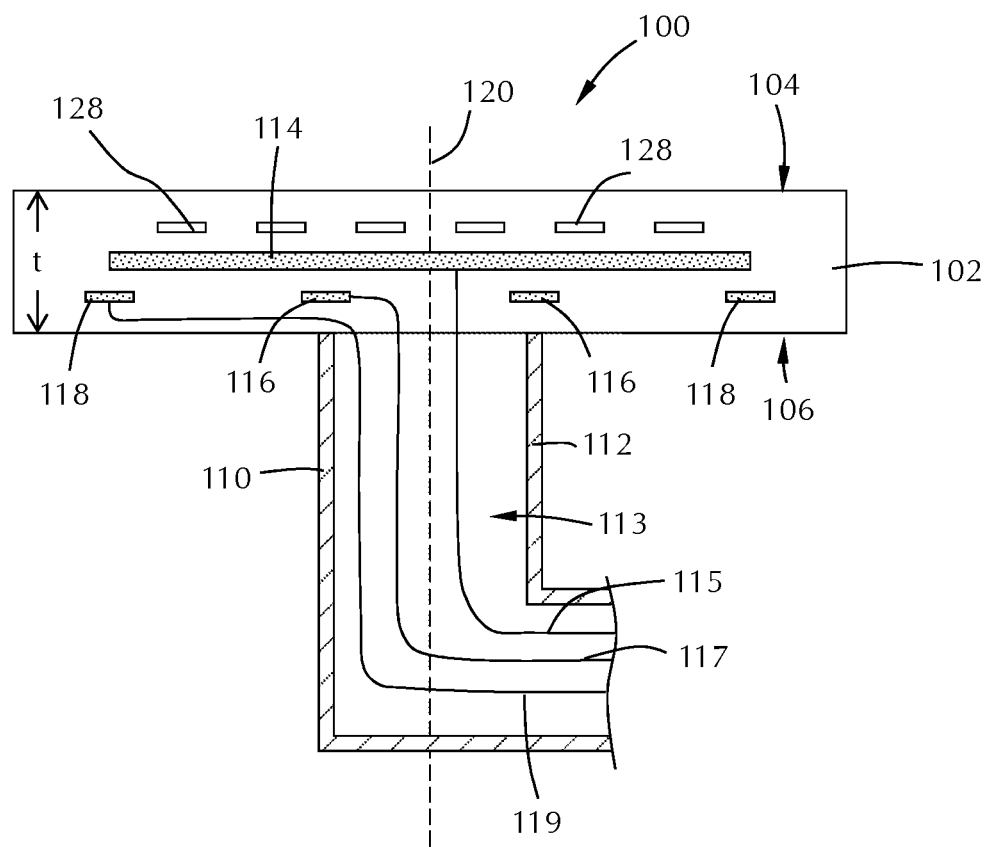
FIG. 1 illustrates a cross-sectional view of the substrate support according to a first exemplary embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure relate to pedestal heater designs to provide uniform temperature distributions on the wafer at multiple operating temperatures (e.g., 150° C.-650° C.). Some embodiments are directed to a multi-zone heating element design is provided for radial and azimuthal temperature uniformity. According to one or more embodiments, a pedestal heater having high thermal mass and/or low contact resistance on the wafer backside minimizes temperature oscillations due to changes in chamber environment.

Some embodiments provide pedestal heaters with independent temperature profile tuning (multi-zonal control) for each wafer in a spatial batch processing tool. In some embodiments, the pedestal provides tunable zones on different planes to enable profile tuning for a wide range of operating temperatures.

The primary heater coil of some embodiments has a depth maximized for temperature uniformity. The primary heater coil can be larger than the wafer. In some embodiments, the primary heater coil provides most of the heater power (e.g., >80%) at any operating temperature.

The inner zone heater of some embodiments is directly above the pedestal shaft to compensate for conduction losses. In some embodiments, the inner zone is designed to provide, for example, less than about 10% of the total power to improve azimuthal uniformity.

The outer zone of some embodiments is used to tune the heater edge temperature to compensate for radiative losses at high temperatures. In some embodiments, the outer zone is on a different layer (depth) than the primary zone to minimize asymmetric coil designs due to "jumper lines". In some embodiments, the outer zone is designed to provide, for example, less than about 10% of the total power to improve azimuthal uniformity.

The mesa height of some embodiments is tuned to provide increased thermal coupling between the wafer and heater. The mesa height of some embodiments is in the range of about 5 micron to about 50 micron.

Referring to the Figures, one or more embodiments of the disclosure are directed to substrate supports 100. The substrate support 100 comprises a top plate 102 having a support surface 104 and a bottom surface 106 defining a thickness (t) of the top plate 102. A shaft 110 is connected to the bottom surface 106 of the top plate 102, the shaft comprising a sidewall 112.

The top plate 102 includes a plurality of heating elements to more uniformly heat a substrate. The top plate contains a primary heating element 114 positioned at a first depth D1 (see FIG. 2) below the support surface 104. In some embodiments, the first depth D1 is greater than or equal to about 50% of the thickness (t) of the top plate 102. In some embodiments, the first depth D1 is greater than or equal to about 55%, 60%, 65%, 70%, 75% or 80% of the thickness (t) of the top plate 102. In some embodiments, the top plate 102 has a thickness (t) in the range of about 10 mm to about 30 mm, or in the range of about 15 mm to about 25 mm or about 20 mm. The depths described are measured to the center of the subject heating element.

The primary heating element 114 can be any suitable heating element known to the skilled artisan with any suitable shape. In some embodiments, the primary heating element 114 has an inner end 114a closer to the central axis 120 and an outer end 114b further from the central axis 120. In some embodiments, the primary heating element 114 is a spiral shaped component with one end of the spiral at or close to the central axis 120 of the top plate 102 and the other end of the spiral a distance from the central axis 120 sufficient to surpass the edge of a substrate to be processed. In some embodiments, the primary heating element 114 is a disc shaped component having a diameter slightly greater than a diameter of a substrate to be processed.

An inner zone heating element 116 is located within the top plate 102 at a second depth D2 from the support surface 104. In some embodiments, the second depth D2 is different than the first depth D1. The second depth D2 of some embodiments is greater than the first depth D1 so that the inner zone heating element 116 is closer to the bottom surface 106 of the top plate 102. In some embodiments, the second depth D2 is less than the first depth D1 so that the inner zone heating element 116 is closer to the support surface 104 of the top plate 102.

In some embodiments, the inner zone heating element 116 is positioned within the top plate 102 over the sidewall 112 of the shaft 110. In some embodiments, the inner zone heating element 116 is centered over the sidewall 112. While the illustrated embodiment shows the inner zone heating element 116 positioned over the sidewall 112 of the shaft 110, the skilled artisan will recognize that the inner zone heating element 116 is not limited to the illustrated location. In some embodiments, the inner zone heating element 116 is positioned to cover one or more of the center of the top plate 102. As used in this manner, the center of the top plate 102 refers to the central axis 120 and/or region around the central axis 120 extending up to about 50% of the radius of the support surface 104 measured from the central axis 120. In some embodiments, the inner zone heating element 116 is positioned aligned with one or more high heat loss regions at or near the central axis 120. In some embodiments, the high heat loss regions are regions (e.g., having an outer diameter greater than the inner diameter by an amount in the range of 5 to 25 mm) where the heat flux exceeds the heat flux of the surrounding region (e.g., the region having an inner diameter beginning at the outer diameter of the subject region) by a predetermined percentage based on process requirements. In some embodiments, the predetermined percentage is in the range of 110% to 300%.

In some embodiments, the inner zone heating element 116 is a spiral shaped element with an inner end closest to the central axis 120 over the sidewall 112. In some embodiments, the inner zone heating element 116 is a spiral shaped element with an outer end furthest from the central axis 120 over the sidewall 112. In some embodiments, the inner zone heating element 116 has an inner end 116a closer to the central axis 120 than an inside surface 112a of the sidewall 112. In some embodiments, the inner zone heating element 116 has an outer end 116b further from the central axis than the outside surface 112b of the sidewall 112.

The top plate 102 of some embodiments has an outer zone heating element 118 at a third depth D3 from the support surface. In some embodiments, the third depth D3 is different than the first depth D1 and/or the second depth D2. The third depth D3 of some embodiments is greater than the first depth D1. In some embodiments, the third depth D3 is about the same as the second depth D2. As used in this manner, the term "about the same depth" means that the depth of the respective zones is within ±10%, ±5%, ±2% or ±1% relative to the average depth. As used herein, the term "different" when describing the depths D1, D2 and/or D3 means up to ±10%, ±5%, ±2% or ±1%.

Figure 2:
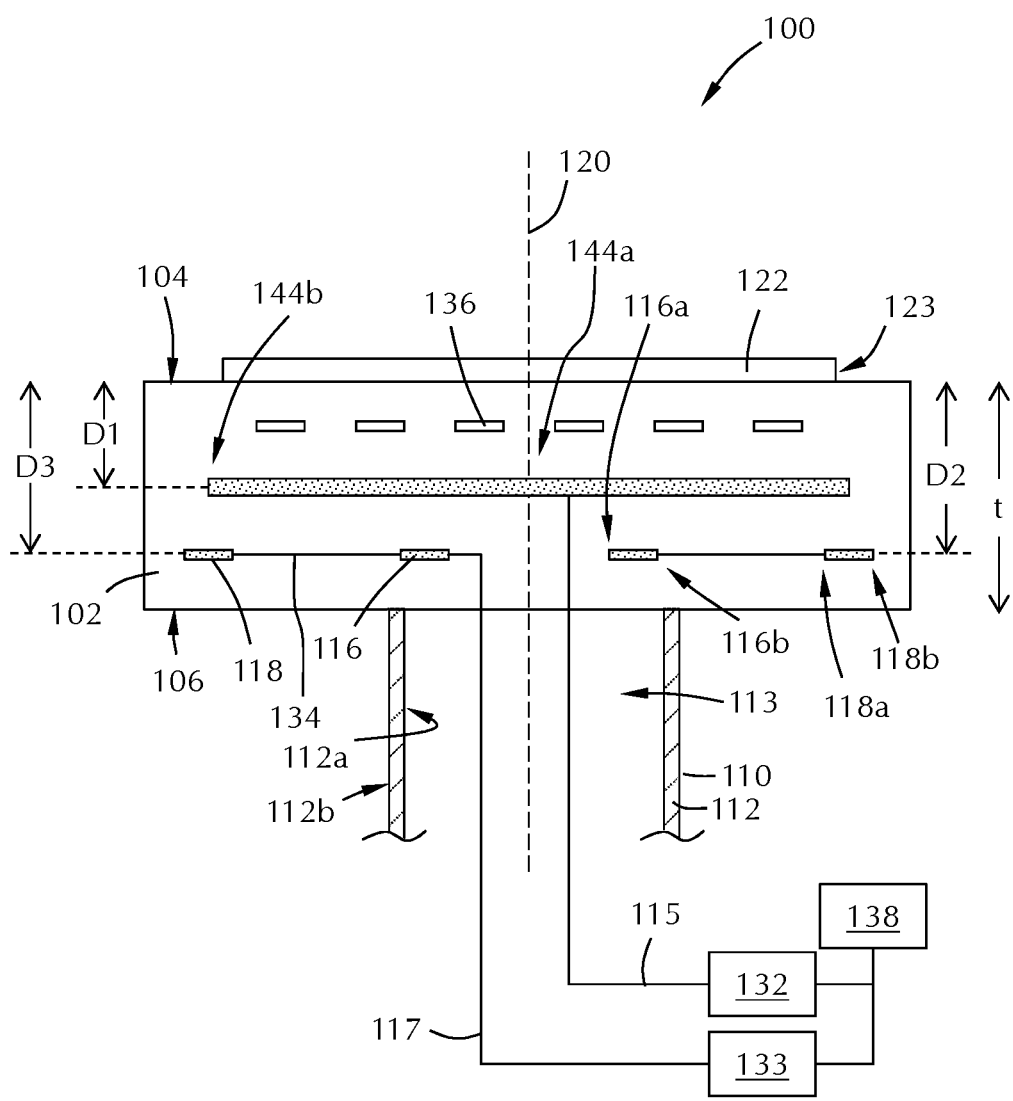
FIG. 2 illustrates a cross-sectional view of the substrate support according to a first exemplary embodiment of the disclosure.

In some embodiments, the outer zone heating element 118 has an inner end 118a and an outer end 118b. The inner end 118a being closer to the central axis 120 than the outer end 118b. In some embodiments, the outer zone heating element 118 extends further from a central axis 120 of the substrate support 100 than the primary heating element 114. In some embodiments, the outer end 118b of the outer zone heating element 118 is further from the central axis 120 than the outer end 114b of the primary heating element 114. In some embodiments, the inner end 118a of the outer zone heating element 118 is closer to the central axis 120 than the outer peripheral edge 123 of a substrate 122 to be processed, as shown in FIG. 2.

The embodiments illustrated have three heating elements 114, 116, 118. The skilled artisan will recognize that more or less heating elements can be incorporated into the top plate 102. In some embodiments, there are two heating elements, the primary heating element 114 and inner zone heating element 116. In some embodiments, there are two heating elements, the primary heating element 114 and outer zone heating element 116. In some embodiments, there are four or more heating elements, the primary heating element 114, inner zone heating element 116, outer zone heating element 118 and one or more intermediate zone heating elements (not shown). The intermediate zone heating elements of some embodiments have a different depth than the inner zone heating element or outer zone heating element. In some embodiments, the intermediate zone heating elements have about the same depth as the inner zone heating element 116 and outer zone heating element 118.

In some embodiments, the shaft 110 of the substrate support 100 is hollow and the sidewalls 112 have a thickness defined between the inside surface 112a and the outside surface 112b. In some embodiments, the shaft 110 is configured to support the top plate 102 and contain additional components for the heating elements within the hollow region 113. In some embodiments, the shaft 110 of the substrate support 100 further comprises a primary heating element power line 115, an inner zone heating element power line 117 and an outer zone heating element power line 119 routed through the hollow shaft 110 to the top plate 102, as shown in FIG. 1. In some embodiments, as shown in FIG. 2, the inner zone heating element power line 117 powers both the inner zone heating element 116 and the outer zone heating element 118. In some embodiments, (the jumper line is a relatively thick wire connecting the outer zone heating element to the brazed alternating current rods for the outer zone heater. In some embodiments, the jumper line does not connect the inner and outer zone.

In some embodiments, the power provided to the primary heating element 114 is greater than the power provided to the inner zone heating element 116 or outer zone heating element 118. The primary heating element 114 of some embodiments is connected to a power supply 132 with an operating power in the range of about 900 W to about 1300 W. In one or more embodiments, the inner zone heating element 116 and the outer zone heating element 118 are connected to one or more power supplies 133 with a power in the range of about 40 W to about 70 W.

In some embodiments, the substrate support 100 is configured as an electrostatic chuck. As shown in FIG. 1, in one or more embodiments, the top plate 102 of the substrate support 100 includes one or more electrodes 128 configured to form an electrostatic chuck. The skilled artisan will understand the construction and arrangement of component for an electrostatic chuck. In some embodiments, the electrostatic chuck comprises two electrodes separated by a dielectric. In some embodiments, the one or more electrodes 128 are configured as a monopolar electrostatic chuck. In some embodiments, the one or more electrodes 128 are configured as a bipolar electrostatic chuck. The one or more electrodes 128 can be connected to one or more power supplies (not shown) to polarize the electrodes to act as an electrostatic chuck.

In one or more embodiments, the top plate 102 of the substrate support 100 further comprises of one or more temperature sensors 136 within the top plate 102. The temperature sensors 136 of some embodiments are used with a feedback circuit to control individual power settings to the primary heating element 114, inner zone heating element 116 or outer zone heating element 118, or additional heating elements (not shown).

Figure 3:
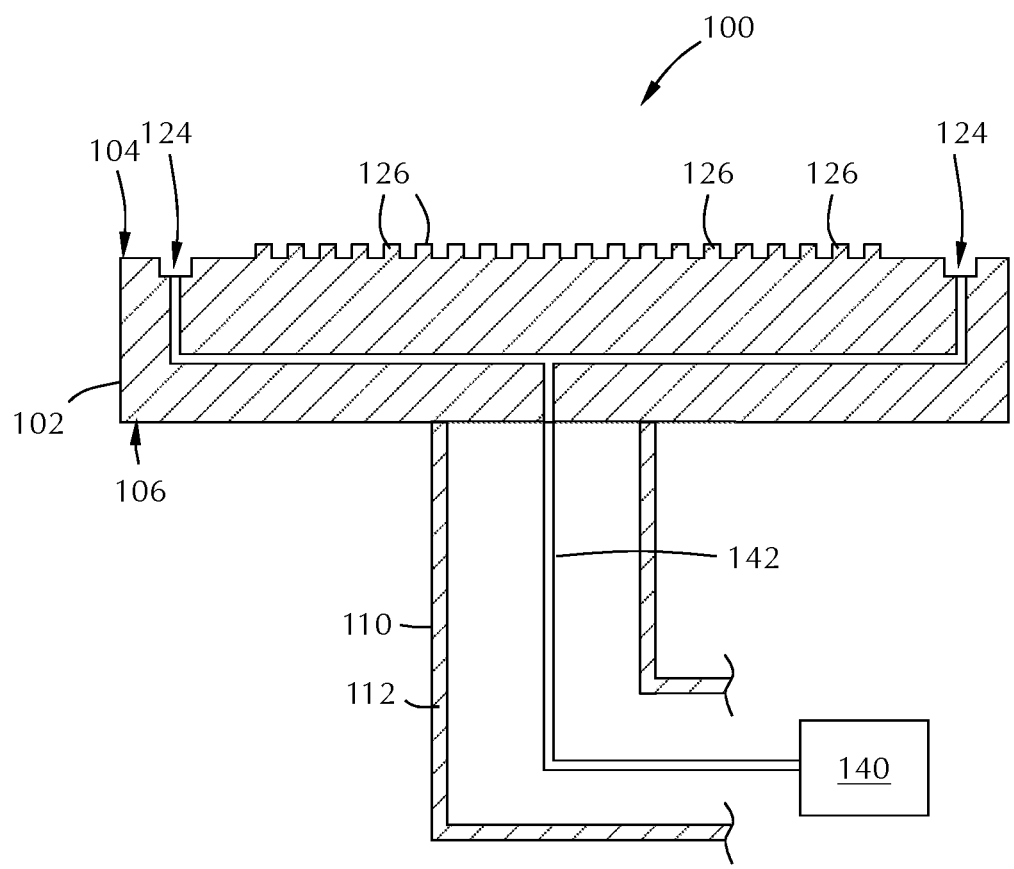
FIG. 3 illustrates a cross-sectional view of the substrate support according to a first exemplary embodiment of the disclosure.

Referring to FIG. 3, some embodiments of the support surface 104 of the top plate 102 comprise a seal band 124. The seal band 124 of some embodiments comprises a circular or semi-circular channel formed around the central axis 120. The seal band 124 of some embodiments is connected to a vacuum source 140 through line 142. In some embodiments, the seal band 124 is connected to a purge gas source instead of a vacuum source through line 142 to provide a flow of backside purge gas to a substrate on the support surface 104. In some embodiments, the purge gas and/or vacuum is routed at the edge as shown in FIG. 3 or at the center of the chuck. In some embodiments, a bevel purge capability is included which directs gas flow to the outer edge of the substrate. In some embodiments, a purge gas is flows around the heater to protect the heater surfaces from deposition to avoid long-term performance deterioration.

Figure 4:
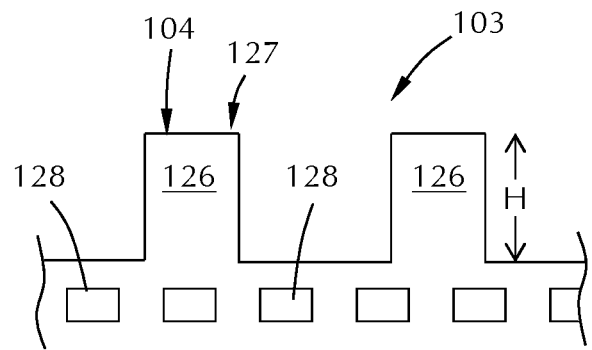
FIG. 4 illustrates a cross-sectional view of the supporting surface according to a first exemplary embodiment of the disclosure.

Referring to FIGS. 3 and 4, some embodiments of the support surface 104 of the top plate 102 include a plurality of mesas 126. FIG. 4 shows an expanded view of a portion of the support surface 103. The top surface 127 of the mesas acts as the local support surface 104. In some embodiments, the mesas 126 have a height (h) in the range of about 10 µm to about 40 µm, or in the range of about 12.5 µm to about 35 µm, or about 15 µm to about 30 µm.

Referring back to FIG. 2, one or more embodiments of the substrate support 100 include a controller 138 comprising one or more configurations selected from a configuration to power the primary heating element 114, a configuration to power the inner zone heating element 116, a configuration to power the outer zone heating element 118, a configuration to measure a temperature of the top plate 102, a configuration to power one or more electrodes 128 within the top plate 102 to electrostatically chuck a substrate 120 to the support surface 104 and/or a configuration to control a vacuum source or purge gas source connected to and in fluid communication with the seal band 124. In some embodiments, there are two or more purge gas sources for backside pressure and bevel purge control.

Figure 5:
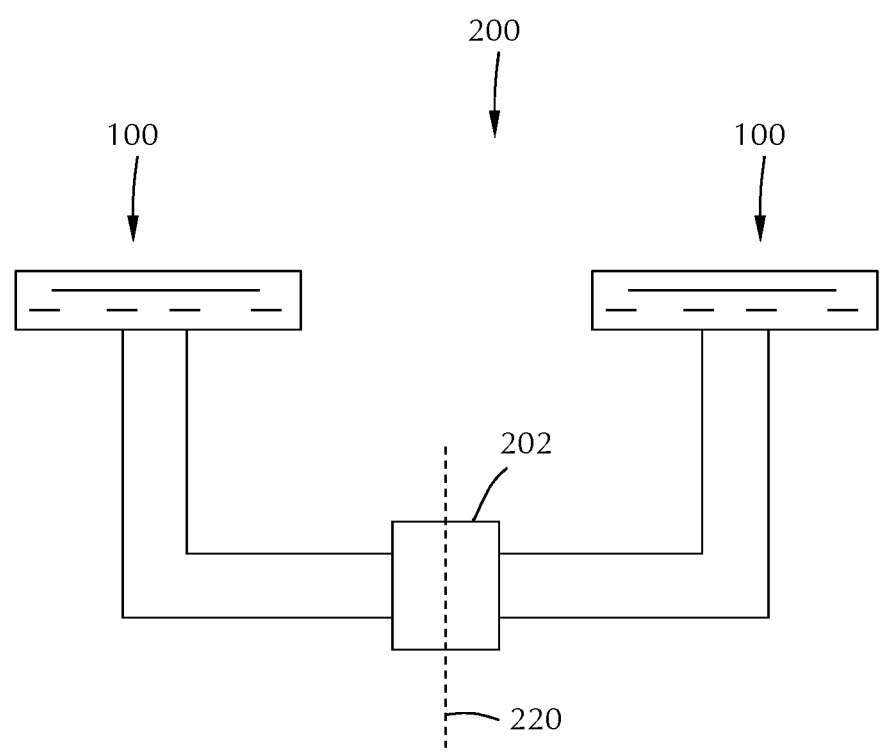
FIG. 5 illustrates a cross-sectional view of the substrate support assembly according to another embodiment of the disclosure.

Referring to FIG. 5, some embodiments of the disclosure are directed to substrate support assemblies 200. The substrate support assembly 200 comprises a plurality of substrate supports 100 connected to a central hub 202. The embodiment illustrated in FIG. 5 shows two substrate supports 100 connected to the central hub 202. In some embodiments, there are three, four, five or six substrate supports 100 connected to the central hub 202. The substrate supports 100 of some embodiments are equally spaced around the periphery of the central hub 202 to create a rotationally symmetric assembly 200.

Some embodiments of the disclosure are directed to methods of processing a substrate 122. A substrate 122 is chucked to a substrate support 100 as described herein. The primary heating element 114 and one or more of the inner zone heating element 116 or the outer zone heating element 118 is powered to heat the top plate 102 and the substrate 122.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A substrate support comprising:
   a top plate positioned on a support shaft, the top plate having a support surface and a bottom surface defining a thickness of the top plate, the support shaft being hollow and comprising a sidewall having a thickness;
   a primary heating element within the top plate at a first depth below the support surface;
   an inner zone heating element within the top plate at a second depth from the support surface greater than the first depth, the inner zone heating element positioned over the sidewall of the support shaft; and
   an outer zone heating element within the top plate at a third depth from the support surface greater than the first depth, the outer zone heating element extending further from a central axis of the substrate support than the primary heating element.

2. The substrate support of claim 1, wherein the inner zone heating element is centered over the thickness of the sidewalls.

3. The substrate support of claim 1, further comprising a primary heating element power line, an inner zone heating element power line and an outer zone heating element power line routed through the hollow shaft to the top plate.

4. The substrate support of claim 1, wherein the first depth is greater than or equal to about 50% of the thickness of the top plate.

5. The substrate support of claim 1, wherein the second depth and the third depth are the same.

6. The substrate support of claim 1, wherein the outer zone heating element is located at a distance from the central axis sufficient to overlap an edge of a substrate to be supported by the support surface.

7. The substrate support of claim 1, wherein the top plate has a thickness in the range of about 10 mm to about 30 mm.

8. The substrate support of claim 1, further comprising a seal band formed on the support surface.

9. The substrate support of claim 8, wherein the top plate has a thickness of about 20 mm.

10. The substrate support of claim 1, further comprising one or more electrodes configured to form an electrostatic chuck.

11. The substrate support of claim 10, wherein the mesas have a height in the range of about 10 µm to about 20 µm.

12. The substrate support of claim 11, further comprising a plurality of mesas formed within the seal band on the support surface.

13. The substrate support of claim 1, wherein the primary heating element is connected to a power supply with a power in the range of about 900 W to about 1300 W.

14. The substrate support of claim 1, further comprising one or more temperature sensors within the top plate.

15. The substrate support of claim 14, wherein the inner zone heating element and the outer zone heating element are connected to one or more power supplies with a power in the range of about 40 W to about 70 W.

16. The substrate support of claim 1, further comprising a controller comprising one or more configurations selected from a configuration to power the primary heating element, a configuration to power the inner zone heating element, a configuration to power the outer zone heating element, a configuration to measure a temperature of the top plate, and/or a configuration to power one or more electrodes within the top plate to electrostatically chuck a substrate to the support surface.

17. A method of processing a substrate comprising:
   powering a primary heating element, an inner zone heating element and an outer zone heating element to control a temperature of a substrate positioned on a support surface of a top plate of a substrate support, the primary heating element positioned within the top plate at a first depth below a support surface of the top plate, the inner zone heating element within the top plate at a second depth different from the first depth, the inner zone heating element aligned with a sidewall of a support shaft of the substrate support, the outer zone heating element within the top plate at a third depth from the support surface different than the first depth.

18. The method of claim 17, wherein the outer zone heating element extends further from a central axis of the substrate support than the primary heating element.

19. The method of claim 17, wherein powering the primary heating element comprises adjusting a power supply with a power in the range of 900 W to 1300 W.

20. The method of claim 19, wherein powering the inner zone heating element and the outer zone heating element comprises adjusting a power supply with a power in the range of 40 W to 70 W.

* * * * *